United States Patent [19]

Kollanyi

[11] Patent Number: 4,792,957
[45] Date of Patent: Dec. 20, 1988

[54] LASER TEMPERATURE CONTROLLER

[75] Inventor: Miklos J. Kollanyi, Albuquerque, N. Mex.

[73] Assignee: GTE Communication Systems Corporation, Phoenix, Ariz.

[21] Appl. No.: 944,044

[22] Filed: Dec. 22, 1986

[51] Int. Cl.$^4$ .............................................. H01S 3/04
[52] U.S. Cl. ...................................... 372/34; 372/36; 357/87
[58] Field of Search ....................... 357/87; 372/34, 36

[56] References Cited

U.S. PATENT DOCUMENTS

| 4,571,728 | 2/1986 | Yoshikawa | 372/36 |
| 4,631,728 | 12/1986 | Simons | 372/34 |
| 4,683,573 | 7/1987 | Albanese | 372/34 |
| 4,689,659 | 8/1987 | Watanabe | 372/34 |
| 4,727,554 | 2/1988 | Watanabe | 372/34 |
| 4,737,798 | 4/1988 | Lonis et al. | 372/34 |

*Primary Examiner*—William L. Sikes
*Assistant Examiner*—Xuan Thi Vo
*Attorney, Agent, or Firm*—Anthony Miologos

[57] ABSTRACT

A laser temperature controller is disclosed for controlling the temperature of a laser device. The controller includes a bridge circuit connected to a thermistor device which is mounted on the laser package. The bridge circuit generates error signals representing a need for cooling or heating as the operating temperature of the laser rises or falls about a set threshold. A voltage conversion circuit converts the error signals to a positive or negative polarity voltage. The output of the voltage conversion circuit is applied to a pair of operational amplifiers which input the voltage and compare it to a set reference voltage. When cooling is required a first amplifier provides a biasing voltage to a transistor when a set threshold is exceeded. The associated transistor switches drive current to a thermoelectric device mounted on the laser package thereby, cooling the laser. Similarly, when heating is required a second amplifier and transistor switches current of an opposite polarity to the thermoelectric device, which heats the laser. The output signal from the voltage conversion circuit is also applied to a laser temperature alarm circuit which provides a visual indication and an alarm signal to a controller interface when a set threshold of laser temperature is exceeded.

2 Claims, 2 Drawing Sheets

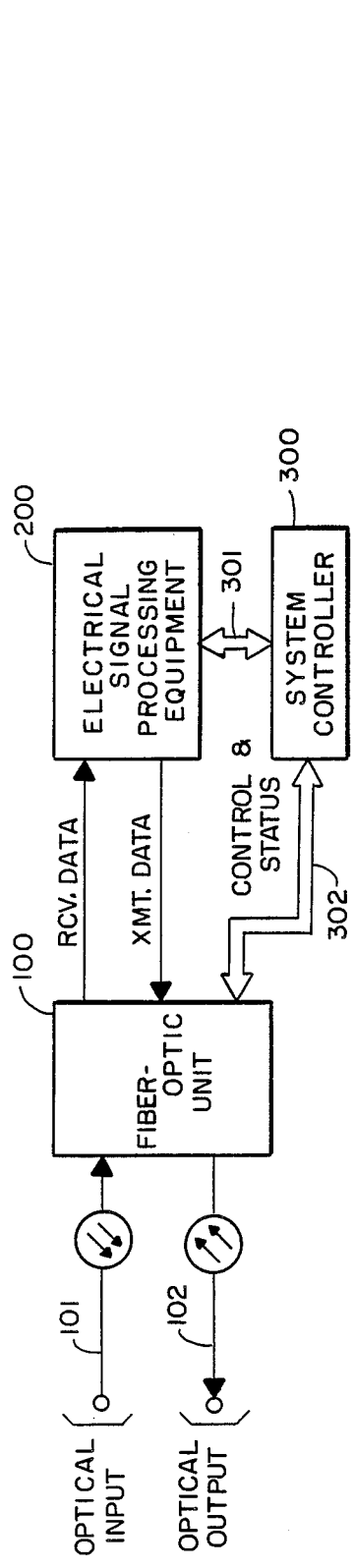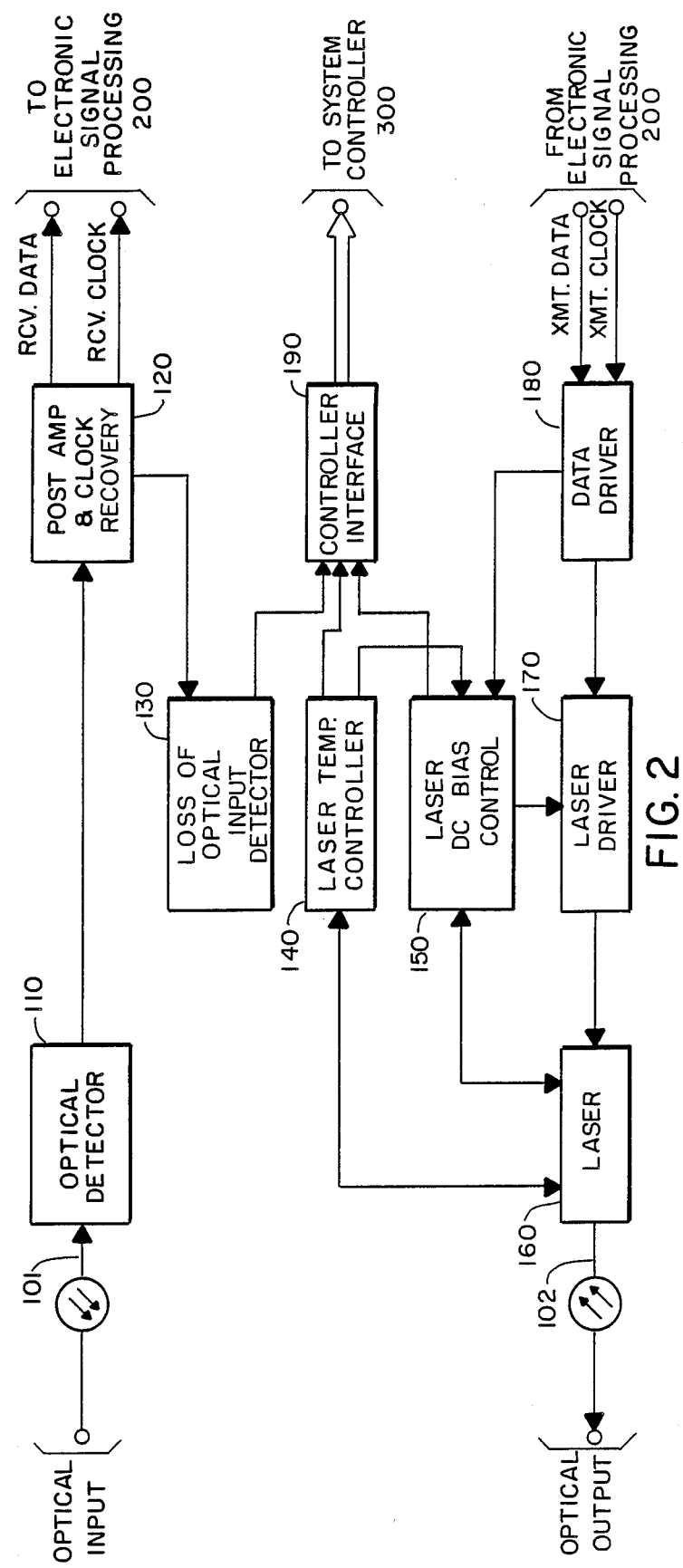

LASER TEMPERATURE CONTROLLER

CROSS-REFERENCE TO RELATED APPLICATIONS

The present application is related to the following co-pending U.S. patent applications all having a common assignee:

Ser. No. 944,045, titled, "Optical Detector Circuit";
Ser. No. 944,046, titled, "Laser Driver Circuit";
Ser. No. 944,043, titled, "Laser Dc Bias Controller";
Ser. No. 944,042, titled, "Loss Of Optical Input Circuit";

BACKGROUND OF THE INVENTION

This invention relates in general to fiber-optic transmitter arrangements and more specifically to a novel laser temperature controller circuit for a fiber-optic transmitter.

Fiber-optic receivers and transmitters or fiber-optic interface units are used in modern telecommunications and data transmission systems between an optical fiber transmission line and electronic digital equipment. The fiber-optic transmitter receives electrical signals from the electronic equipment representing the data to be transmitted. The transmitter then converts the data to light pulses which are coupled to an optical fiber transmission line. The fiber-optic receiver receives light pulses representing the transmitted data from an optical fiber transmission line and converts the light pulses to electrical signals which are sent to and processed by the electronic digital equipment. These systems work in very high transmission rates from 145 Mbs to 2400 Mbs (Megabits per second).

Transmission of data or other signals along optical fiber transmission lines have advantage in the fact that light rays are almost immune to electromagnetic interference such as sparks, lightening, crosstalk and other interference which may be induced into the transmission line.

Many fiber-optic transmitters use a high output solid state light emitting device or laser diode to produce the light pulses used in the transmission of data. The electrical signals received from the electronic equipment are input into a laser drive circuit which modulates the laser diode producing the light output signals.

The power efficiency of a laser diode is the ratio of optical power output to input power. Both power and quantum efficiency are strongly temperature dependent. A laser diode may exhibit a shift in wavelength equal to a 2.2 A (Angstrom) per degree K (Kelvin). The temperature rise of the laser diode junction during a current pulse, therefore, causes an increase in the wavelength during the pulse.

Further, since the junction temperature rises during each individual current pulse, this would tend to cause a decrease in quantum efficiency as well as the aforementioned wavelength shift. If the temperature of the laser diode is permitted to rise too high during a drive pulse the laser would eventually quench itself. This effect reduces the power efficiency if the pulse length is increased beyond a certain point.

It therefore becomes an object of the present invention to disclose a novel laser temperature controller for monitoring and controlling the operating temperature of a laser diode used in a fiber-optic transmitter.

SUMMARY OF THE INVENTION

In accomplishing the object of the present invention there is provided an arrangement for controlling the temperature of a light emitting device or laser. The light emitting device includes a temperature sensing element for sensing its temperature and a thermoelectric unit which provides a source of cooling and heating for the light emitting device. The thermoelectric unit provides cooling to the light emitting device when a current of a first direction is input to the thermoelectric unit and heating when a current of a second and opposite direction is input.

The arrangement of the present invention includes sensing means connected to the temperature sensing element. The sensing means generates a first error signal representing a need for cooling when the temperature of the light emitting device rises above a set threshold.

The sensing means is connected to conversion means which receive the first error signal and convert it into a voltage signal.

A first amplifier means connected to the conversion means and to a reference voltage, is disposed to produce an output signal responsive to the voltage signal exceeding the reference voltage. The output signal of the first amplifier means is connected to first switch means and to a source of electrical current of a first direction.

Responsive to the first switch means receiving the first amplifier means output signal, the electrical current of the first direction is sent to the thermoelectric unit which provides cooling for the light emitting device.

The sensing means of the present invention also generates a second error signal representing a need for heat, when the temperature of the light emitting device drops below a set threshold. The conversion means also converts the second error signal into a voltage signal.

The voltage signal is fed to a second amplifier means. The second amplifier means is also connected to a reference voltage source and produces an output signal responsive to the voltage signal exceeding the reference voltage. A second switch means connected to the output of the second amplifier means and to a source of electrical current of a second direction, received the output of the second amplifier and switches the electrical current of the second direction to the thermoelectric unit. The thermoelectric unit then produces heat for the light emitting device.

In order to report a laser temperature problem to a system controller, the laser temperature controller of the present invention further includes a voltage rectification means connected to the conversion means. The voltage rectification means is arranged to receive the conversion means output signal and produce a voltage signal of a specific polarity. This voltage signal is applied to comparator means. The input voltage signal is compared to a reference voltage. When the input voltage exceeds the reference voltage an output signal is produced which is sent to alarm means.

The alarm means sends an alarm signal to a controller interface indicating a laser temperature problem.

A BRIEF DESCRIPTION OF THE DRAWINGS

A better understanding of the invention may be had from the consideration of the following detailed description taken in conjunction with the accompanying drawings in which:

FIG. 1 is a block diagram of illustrating the interconnections of a Fiber-Optic Interface Unit to Electrical Signal Processing Equipment and to a System Controller;

FIG. 2 is block diagram detailing the structure of the Fiber-Optic Unit and including the optical detector of the present invention;

DESCRIPTION OF THE PREFERRED EMBODIMENT

Figure 3:
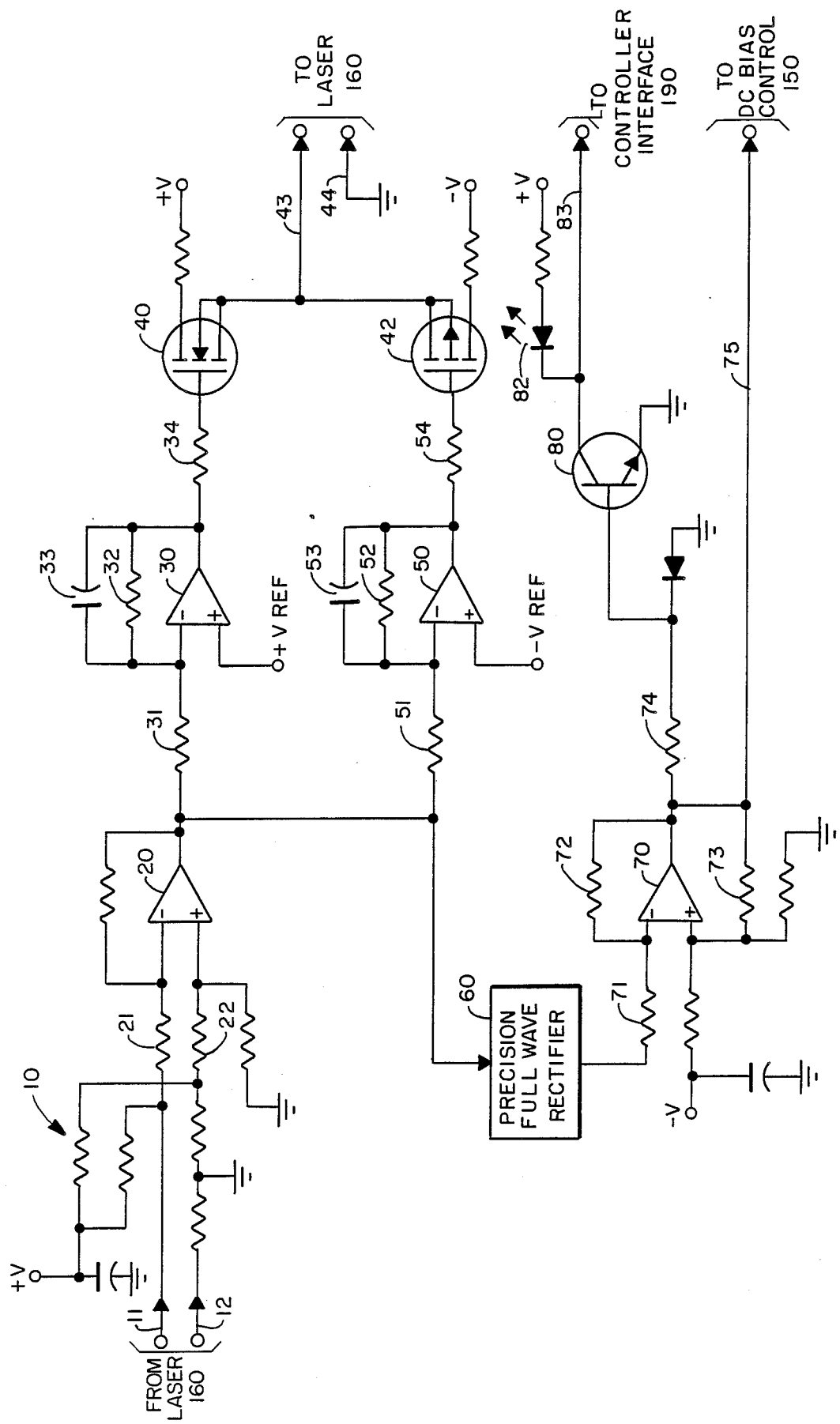
FIG. 3 is detailed schematic of the laser temperature controller of the present invention.

Turning now to FIG. 1 of the included drawings a representation of a system for converting light pulses to electrical signals which uses the laser temperature controller of the present invention is shown. The system shown includes a Fiber Optic Unit (FOU) 100, Electrical Signal Processing Equipment (ESP) 200 and a System Controller (SC) 300.

In the receive path, (data flow away from the optical fiber) a single mode optical fiber light guide is terminated in the FOU 100. The FOU 100 detects the light pulses and converts the received light pulses to electrical pulses. The electrical pulses are amplified and then fed via the RCV DATA line to the ESP 200 equipment where the received data is recovered and used. The ESP 200 equipment can be any digital and/or analog device which can use the recovered data. For example, in telecommunication equipment the ESP equipment can represent a switching system for routing telephone calls from one subscriber to the other. Still in another example the ESP equipment could represent a central computer connected to peripheral terminals via a fiber-optic network.

In the transmit path, (data flow toward the optical fiber) electrical signals in the form of digital pulses are fed to the FOU 100 from the ESP 200 via XMT DATA line. The digital pulses are then passed to a laser driver circuit in the FOU 100 which intensity modulates a solid state laser. The optical energy from the laser is coupled into a single mode optical fiber 102 and transmitted as light pulses down the optical fiber to receiving equipment (not shown). A system control SC 300 receives and sends control and status information from/to the FOU 100. For example, the controller can monitor the FOU to determine if an optical signal is being received in order to signal the ESP 200 that data from the FOU is available, or the SC 300 can receive status information concerning the temperature of the transmitting laser or if it has failed.

Turning now to FIG. 2 a description and explanation of the operation of the FOU 100 of the above described system will now be given. In the receive path, the Optical Fiber input 101 is input to an Optical Detector 110. The Optical Detector converts the optical energy into electrical signals and then amplifies the received signals.

The amplified electrical signals are passed to a Post Amp & Clock Recovery Circuit 120 where they are further amplified and a clock signal is extracted from the input electrical signal. The extracted clock is reclocked and the data and clock are passed on to the ESP 200 via the RCV. DATA line and RCV. CLOCK line respectively.

A Loss of Optical Input Detector 130 is connected to the Post Amp & Clock Recovery Circuit. The Loss of Optical input Detector 130 is arranged to send an alarm signal to a Controller Interface 190 whenever the optical input level drops below a preset threshold. The Controller Interface 190 then outputs the alarm to the SC 300.

In the transmit path, electrical signals in the form of digital pulses and a clock signal are input to the Data Driver 180 from the ESP 200 on lines XMT. DATA and XMT. CLOCK respectively. The Data Driver reclocks the data transmitted from ESP 200 using the XMT. CLOCK signal. The output of the Data Driver 180 is sent to the Laser Driver circuit 170 which in turn modulates Laser 160 converting the input electrical signals to an optical signal. The laser light output is coupled into a single mode fiber and transmitted out on Optical Output 102.

The transmit path further includes a Laser DC Bias Control arranged to turn off the laser 160 in case the data drive fails. This prevents the laser from being continuously turned on.

A Laser Temperature Controller 140 is also included and used to control the laser temperature and also the optical output level. Both the laser temperature controller 140 and Laser DC Bias Control 150 send alarm signals to the Controller Interface 190 in the event that the laser has failed, its temperature is out of limits, or the Data Drive circuit has failed.

Turning now to FIG. 3 a description of the laser temperature controller of the present invention will now be given. A temperature sensing device or thermistor (not shown) is mounted on a cold plate along with the laser 160. The thermistor is connected to the laser temperature controller via leads 11 and 12. The thermistor provides a 10 K ohm resistance to bridge circuit 10 when the laser cold plate is at 25 deg.C. The aforementioned resistance balances the bridge circuit 10. With the bridge balanced, input voltage to amplifier 20 is zero and transistors 40 and 42 are off. With transistors 40 and 42 off no current is provided via leads 43 and 44 to a thermoelectric cooling element (not shown) in the laser package.

When the temperature of the cold plate goes higher than 25 deg.C the amplifier 20 senses an error voltage developed by the bridge circuit 10 and outputs a positive voltage indicating a need for cooling. The positive output voltage from amplifier 20 is applied to amplifiers 30 via resistor 31 and to amplifier 50 via resistor 51. Resistor 32, capacitor 33 and resistor 52, capacitor 53 set the operating characteristics of amplifiers 30 and 50 respectively.

Since the output voltage of amplifier 20 is greater than the negative reference voltage applied to the positive input of amplifier 50, amplifier 50 outputs a positive bias voltage to the base of transistor 42 via resistor 54. The bias voltage turns on transistor 42 providing a cooling current via leads 43 and 44 to the thermoelectric cooler attached to the cold plate of laser 160.

Similarly, when the temperature of the cold plate goes lower than 25 deg.C., amplifier 20 senses an error voltage developed by bridge circuit 10 and outputs a negative voltage indicating a need for heating. The negative voltage is applied to amplifiers 30 and 50. Amplifier 30 responds to the negative voltage by turning on transistor 40. Transistor 40 provides a heating current which is opposite to that of the cooling current via leads 43 and 44 to the thermoelectric cooler. The reference voltages applied to amplifiers 30 and 50 must be overcome before transistors 40 and 50 respectively will turn on. This is to avoid any overlap in the operation of the two transistors.

The error voltages developed by amplifier 20 are also applied to a precision full wave rectifier circuit shown as 60. The rectifier 60 provides a positive output of the error voltage to the negative input of amplifier 70 via resistor 71. Amplifier 70 and resistors 72 and 73 form a voltage comparator with hysterasis. When the error voltage output by rectifier 60 exceeds a preset threshold voltage that is applied to the positive input of amplifier 70, the output of amplifier 70 goes positive. This turns on transistor 80 and light emitting diode (LED) 82. Additionally, a negative logic signal is output via lead 83 to the controller interface 190 indicating a laser temperature alarm.

Simultaneously, the positive output voltage of amplifier 70 is applied to the laser DC bias controller 150 via lead 75 which turns off the lasers operating DC bias. This effectively shuts down the laser 160.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. An arrangement for controlling the temperature of a light emitting device, said light emitting device including a temperature sensing element for sensing the temperature of said light emitting device and a thermoelectric unit which provides a source of cooling to said light emitting device when a current of a first direction is input to said thermoelectric unit and, a source of heat when a current of a second and opposite direction is input to said thermoelectric unit, said arrangement comprising:

bridge circuit means connected to said temperature sensing element, said bridge circuit means arranged to generate a first error signal representing a need for cooling said light emitting device when the temperature of said light emitting device rises above a set threshold, and a second error signal representing a need for heating said light emitting device when the temperature of said light emitting device falls below a set threshold;

conversion means including an input and an output, said conversion means input connected to said bridge circuit means, and said conversion means arranged to convert said first and said second error signals into a voltage signal;

first amplifier means connected to said conversion means output, and said first amplifier means further connected to a positive reference voltage source, and second amplifier means connected to said conversion means output, and said second amplifier means further connected to a negative reference voltage source, said first amplifier arranged to produce an output signal responsive to said conversion means voltage signal exceeding said first amplifier reference voltage, and said second amplifier means arranged to produce an output signal responsive to said conversion means voltage signal exceeding said second amplifier reference voltage; and, first switch means connected to the output of said first amplifier means and to a source of electrical current of a first direction, and second switch means connected to the output of said second amplifier means and to a source of electrical current of a second direction, and in response to said first amplifier means output signal said first switch means is arranged to provide said electrical current of said first direction to said thermoelectric unit, whereby, said thermoelectric unit provides a source of cooling for said light emitting device, and alternately in response to said second amplifier means output signal said second switch means is arranged to provide said electrical current of said second direction to said thermoelectric unit, whereby, said thermoelectric unit provides a source of heating for said light emitting device.

2. The arrangement as claimed in claim 1, wherein: said arrangement further includes;

voltage rectification means connected to said conversion means, said voltage rectification means arranged to receive said conversion means output signal and produce a voltage signal of a specific polarity;

comparator means connected to said voltage rectification means and to a reference voltage source, said comparator means arranged to produce an output signal when said voltage signal from said rectification means exceeds said reference voltage source; and alarm means connected to said comparator means output, said alarm means arranged to send an alarm signal to a controller means responsive to said output signal from said comparator means.

* * * * *